United States Patent
Lee

(10) Patent No.: US 7,091,105 B2
(45) Date of Patent: Aug. 15, 2006

(54) METHOD OF FORMING ISOLATION FILMS IN SEMICONDUCTOR DEVICES

(75) Inventor: Won Kwon Lee, Chungjoo-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 266 days.

(21) Appl. No.: 10/622,532

(22) Filed: Jul. 18, 2003

(65) Prior Publication Data

US 2004/0082177 A1   Apr. 29, 2004

(30) Foreign Application Priority Data

Oct. 28, 2002 (KR) ............... 10-2002-0065753
Oct. 28, 2002 (KR) ............... 10-2002-0065754
Dec. 26, 2002 (KR) ............... 10-2002-0084281

(51) Int. Cl.
*H01L 21/76* (2006.01)
(52) U.S. Cl. .............. 438/424; 438/425; 438/426
(58) Field of Classification Search ........ 438/424–431, 438/689–693, 717, 719, 723–725
See application file for complete search history.

(56) References Cited

U.S. PATENT DOCUMENTS

| | | | |
|---|---|---|---|
| 5,998,278 A * | 12/1999 | Yu ............... | 438/424 |
| 6,277,707 B1 * | 8/2001 | Lee et al. ............ | 438/430 |
| 6,413,828 B1 | 7/2002 | Lam | |
| 6,461,937 B1 * | 10/2002 | Kim et al. ............ | 438/431 |
| 6,589,879 B1 * | 7/2003 | Williams et al. ........ | 438/714 |
| 2002/0155708 A1 * | 10/2002 | Lo et al. ............ | 438/689 |
| 2003/0022458 A1 * | 1/2003 | Koh ............... | 438/424 |

OTHER PUBLICATIONS

Li, C.H. et al. "A robust shallow trench isolation (STI) with SiN pull-back process for advanced DRAM technology," *Advanced Semiconductor Manufacturing* 2002, *IEEE/SEMI Confrence and Workshop* 2002 pp. 21-26.

* cited by examiner

*Primary Examiner*—Duy-Vu N Deo
(74) *Attorney, Agent, or Firm*—Marshall, Gerstein & Borun LLP

(57) ABSTRACT

Disclosed is a method of forming the isolation film in the semiconductor device which can prevent concentration of an electric field by forming a dual slant angle at the top corner of the trench in the course of forming the trench. After a photoresist pattern containing silicon components or an amorphous silicon film is formed on a pad oxide film instead of a pad nitride film, the surface of the photoresist pattern or the amorphous silicon film is oxidized so that the oxidized portion is fused with the isolation film. Accordingly, it is possible to prevent generation of a moat in the course of removing the photoresist pattern and the pad oxide film after the trench is buried with an insulating material. Therefore, the disclosed method can improve reliability of the process and an electrical characteristic of the resulting device.

18 Claims, 8 Drawing Sheets

METHOD OF FORMING ISOLATION FILMS IN SEMICONDUCTOR DEVICES

BACKGROUND

1. Technical Field

A method for forming isolation films in semiconductor devices are disclosed, and more particularly, methods for forming isolation films in semiconductor devices are disclosed that are capable of preventing generation of undesirable moats and concentrations of electric fields at and on top corners of the isolation films that are formed by STI (shallow trench isolation) process.

2. Background of the Related Art

In general, the semiconductor substrate is divided into an active region where various semiconductor devices including transistors are formed, and an isolation region where an isolation film is located for electrically isolating the semiconductor devices of the active region.

A process of forming the isolation film includes a LOCOS (local oxidation) process, a PBL (poly buffered LOCOS) process and a STI (shallow trench isolation) process. The LOCOS process is one by which the pad oxide film and the pad nitride film are sequentially formed, the substrate of the isolation region is exposed by an etch process and the exposed region of the substrate is then oxidized by an oxidization process to form the isolation film. The PBL process is one of intervening a polysilicon film serving as a buffer between the pad oxide film of the LOCOS process and the pad nitride film. The STI process is one by which the pad oxide film and the pad nitride film are sequentially formed, the substrate of the isolation region is exposed by the etch process, the exposed region of the substrate is etched to form a trench and the trench is then buried with an insulating material to form the isolation film.

In the above, in the LOCOS process, a high temperature oxidization process is performed for a long period of time and a channel impediment ion implanted into the substrate is laterally diffused resulting in a "bird's beak" phenomena. As a result, the electrical characteristics of the device is degraded. Accordingly, the LOCOS process is not used for devices smaller than the 0.25 μm design rule.

In order to solve this problem of the LOCOS process, an isolation film may be formed using the STI process in the manufacture process of below the 0.25 μm design rule. In case where the isolation film is formed by the STI process, there are advantages that the bird's beak does not occur and the isolation characteristic is good.

However, there are problems in that the electrical characteristic of the device is degraded since an electric field is concentrated on the top corner and the bottom corner of the isolation film. Furthermore, as the design rule becomes small, there is a difficulty in burying the trench with an insulating material. Also, after an insulating material layer is formed on the entire structure in order to bury the trench with the insulating material, a polishing process such as a chemical mechanical polishing (CMP) process has to be performed in order to leave the insulating material only in the trench. Due to this, there are problems that the "Homp characteristic" is deteriorated and the uniformity of the substrate surface is degraded, since a moat structure is generated at the top corner of the isolation film.

SUMMARY OF THE DISCLOSURE

A method of forming an isolation film in a semiconductor device is disclosed that is capable of improving the reliability of the process and the electrical characteristic of the resulting device, in such a manner that a dual tilt angle is formed at the top corner of the trench in the process of forming the trench in order to prevent any concentration of an electric field and generation of a moat.

A disclosed method of forming an isolation film in a semiconductor device comprises forming a stack structure of a pad oxide film and a silicon containing photoresist pattern in which an isolation region is defined on a semiconductor substrate, implementing an over etch so that polymer is formed at both corners of the isolation region to form an etch slant face at both corners of the isolation region while etching the semiconductor substrate at the central portion of the isolation region, forming a trench at the central portion of the isolation region, oxidizing the surface of the photoresist pattern to form a surface oxide film, forming an insulating material layer on the entire structure to bury the trench, and implementing a polishing process until the photoresist pattern remains to a given thickness and then removing the photoresist pattern and the pad oxide film.

BRIEF DESCRIPTION OF THE DRAWINGS

The above and other features of the disclosed methods will be apparent from the following detailed description of the preferred embodiments in conjunction with the accompanying drawings, wherein.

DETAILED DESCRIPTION OF THE PRESENTLY PREFERRED EMBODIMENTS

Reference will now be made in detail to the preferred embodiments, examples of which are illustrated in the accompanying drawings.

FIG. 1a through FIG. 1h are cross-sectional views of semiconductor devices for explaining a method of forming an isolation film in the device according to one embodiment.

Figure 1A:
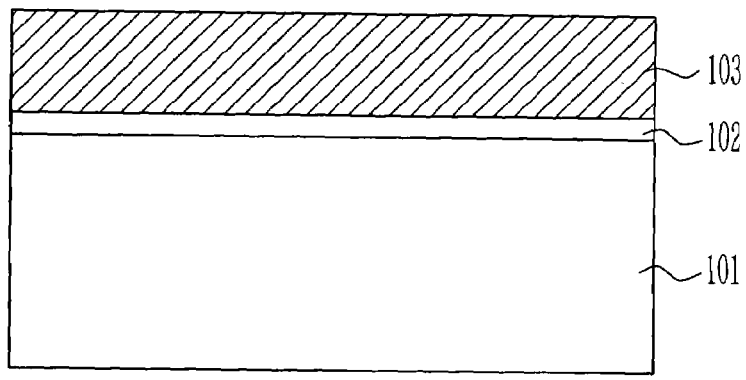
FIG. 1a through FIG. 1h are cross-sectional views of semiconductor devices for explaining a disclosed methods for forming an isolation film in a device according to one embodiment.

Referring now to FIG. 1a, a pad oxide film 102 and a photoresist film 103 are sequentially formed on a semiconductor substrate 101. A t this time, the photoresist film 103 is formed in thickness in the range of 3000 to 10000 Å using a photoresist comprising from about 7 to about 50% contained silicon.

Figure 1B:
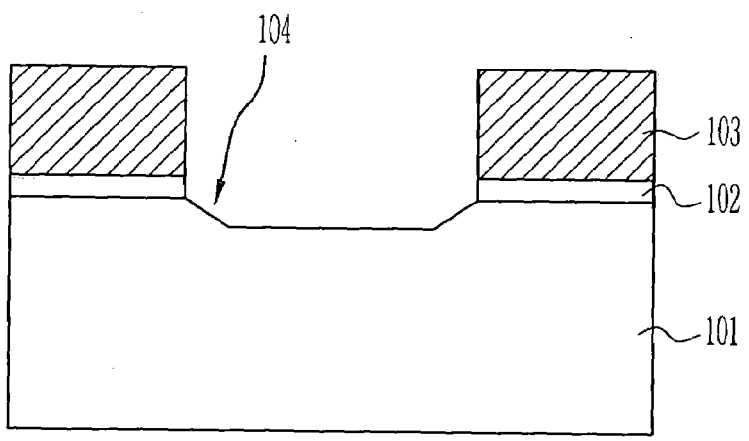

By reference to FIG. 1b, the photoresist of the isolation region is removed by exposure and development process, thus forming a photoresist pattern 103 defined by the isolation region. After the photoresist pattern 103 is formed, the exposed pad oxide film 102 from which the photoresist is removed is removed by a dry etch process, so that the surface of the semiconductor substrate 101 in the isolation region is exposed.

Thereafter, an over etch process is implemented while polymer (not shown) is accumulated at the corner of the exposed semiconductor substrate 101, whereby the central portion of the isolation region is more etched than the corner portions of the isolation region to form an etch slant face 104 at the substrate 101 of the corner. At this time, the width and tilt angle of the etch slant face 104 formed at the corner of the isolation region could be adjusted considering the degree of integration in the device. Preferably, the width of the etch slant face 104 is made from about 0.02 µm to about 0.07 µm and the tilt angle of the etch slant face 104 is made from about 20 to about 50°.

This over etch is performed using a $CHF_3$ gas, a $CF_4$ gas or a mixed gas of them as an etch gas. At this time, the supply flow of $CHF_3$ ranges from 50 to 70 seem, the supply flow of $CF_4$ is from about 30 to about 50 sccm and an Ar gas flow from about 1000 to about 2000 sccm is supplied as a carrier gas. Meanwhile, the over etch process is implemented for 5 to 30 seconds with a pressure from about 500 to about 2500 mTorr or power from about 600 to about 2000 W is applied. The over etch process is performed so that the central portion of the isolation region is etched from about 50 to about 400 Å.

Figure 1C:
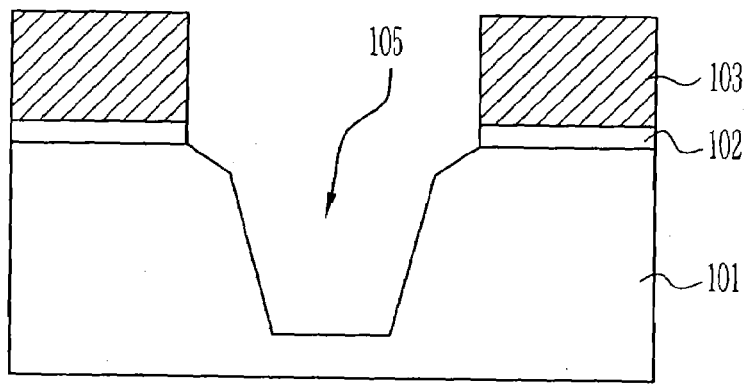

With reference to FIG. 1c, the semiconductor substrate 101 of the isolation region is etched to a given depth to form a trench 105. At this time, as polymer (not shown) accumulated on the etch slant face 104 of the isolation region serves as an anti-etch film upon implementation of the over etch process in FIG. 1b, the corners of the isolation region are not etched but the shape of the etch slant face 104 remains intact. Therefore, as only the central portion of the isolation region is etched, the trench 105 is formed at the central portion of the isolation region. Due to this, the top corner of the trench 105 is made round by the etch slant faces formed by the over etch process in FIG. 1b.

At this time, the etch process for forming the trench 105 is implemented to form the trench 105 in the range of from about 2500 to about 4000 Å in depth using a HBr gas and a $Cl_2$ gas and make the tilt angle of the sidewall of the trench 105 in the range of 70 to 90° on the basis of the surface of the semiconductor substrate 101. The supply flow of the HBr gas is controlled to the range of from about 100 to about 150 sccm and the supply flow of the Cl2 gas is controlled to the range of from about 35 to about 70 sccm.

After the trench 105 is formed, an ATC (after treatment chamber) process is performed for a time period ranging from 30 seconds to 1 minute to compensate for etch damage occurred at the sidewall and bottom of the trench 105.

Figure 1D:
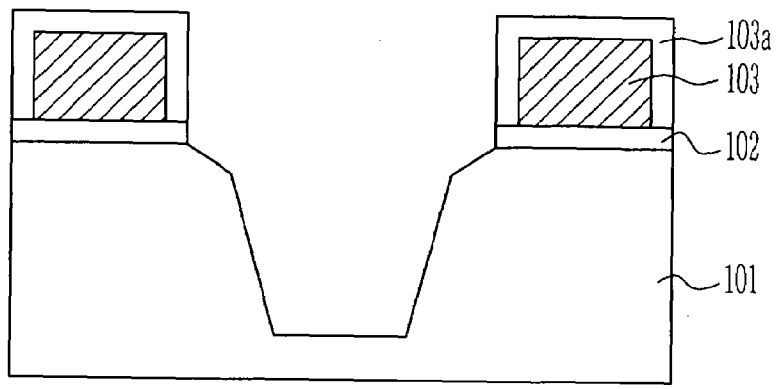

Turning to FIG. 1d, the surface of the photoresist pattern 103 containing silicon components is oxidized to form a surface oxide film 103a. It should be noted that the surface oxide film 103a might be formed by oxidizing the surface of the photoresist pattern 103 through $O_2$ plasma processing. The $O_2$ plasma processing method may include a method of implementing $O_2$ ashing at a temperature in the range of from about 50 to about 200° C., a method using $O_2$ ion implantation process.

Figure 1E:
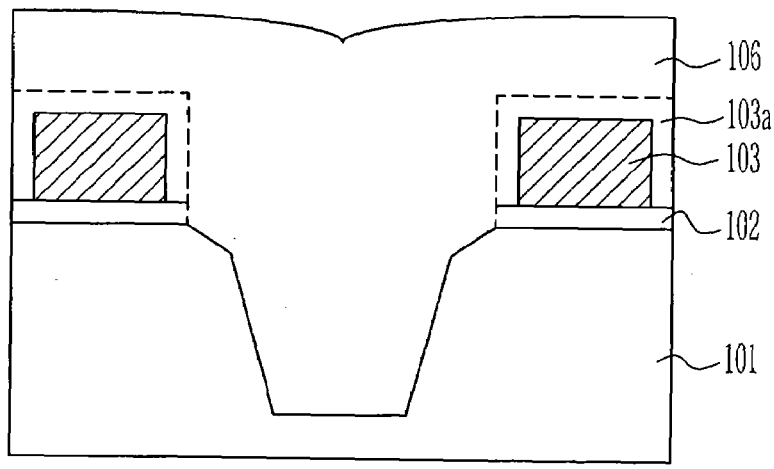

Referring to FIG. 1e, an insulating film 106 is formed on the entire structure so that the trench 105 is completely buried. At this time, it should be noted that the insulating film 106 could be formed using a low thermal oxide film so that it does not have influence on the photoresist pattern 103. The low thermal oxide film is formed at a temperature in the range of from about 50 to about 300° C. Meanwhile, the thickness of the insulating material layer 106 may be decided considering the margin of a chemical mechanical polishing process that will be performed in a subsequent process.

Figure 1F:
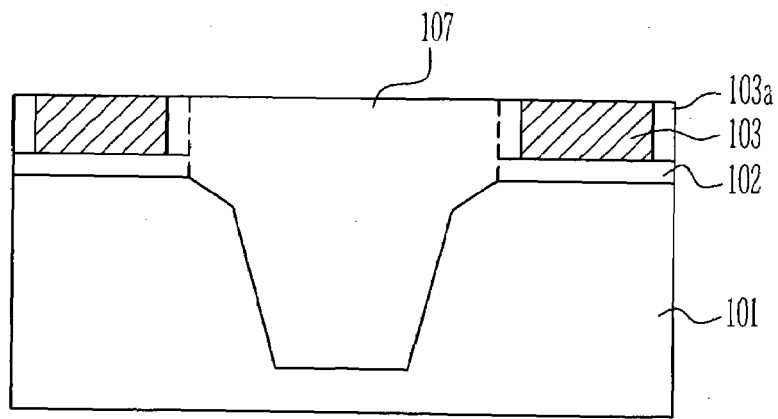

By reference to FIG. 1f, the top of the insulating material layer (106 in FIG. 1e) is removed by a given thickness until the photoresist pattern 103 is exposed by means of a polishing process such as the chemical mechanical polishing process. Thereby, the insulating material layer remains only in the trench, so that the isolation film 107 made of the insulating material layer is formed. At this time, as the height of the remaining photoresist pattern 103 determines the height of the isolation film 107 that is protruded higher than the surface of the semiconductor substrate 101, the polishing process must be performed considering it.

Figure 1G:
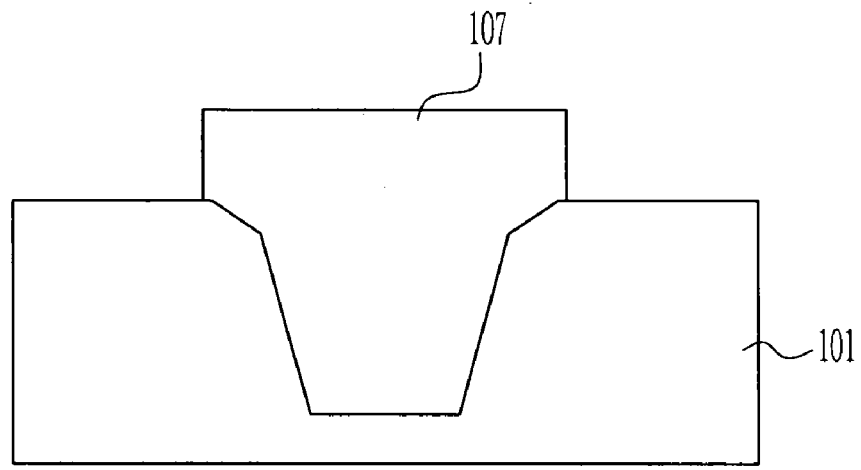

Turning to FIG. 1g, the photoresist pattern (10 in FIG. 1f) is removed by an ashing processing. Meanwhile, the pad oxide film (102 in FIG. 1f) below the photoresist pattern is removed by a pre-cleaning process. Thereby, the isolation film 107 is completed.

Figure 1H:
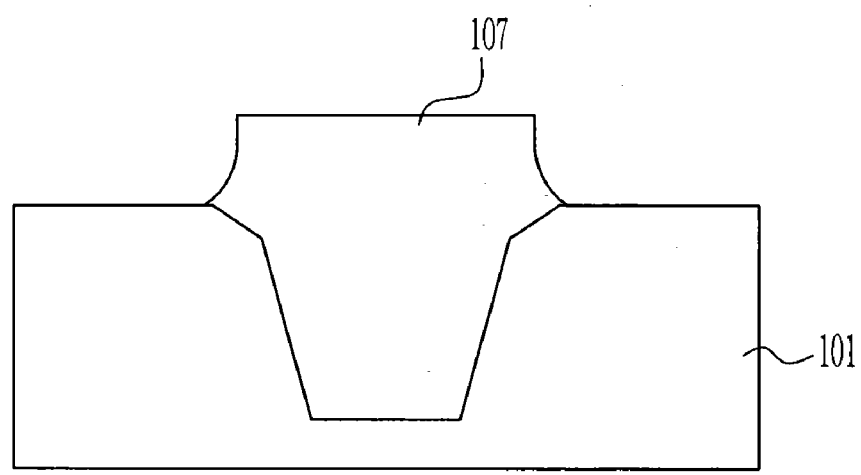

From FIG. 1h, it can be seen that a moat did not occur even when the isolation film 107 is formed by the above process although both corner portions of the isolation film are etched by etch and cleaning processes being a subsequent process after the isolation film 107 is formed.

FIG. 2a through FIG. 2i are cross-sectional views of the semiconductor devices for explaining the disclosed method according to another embodiment.

Figure 2A:
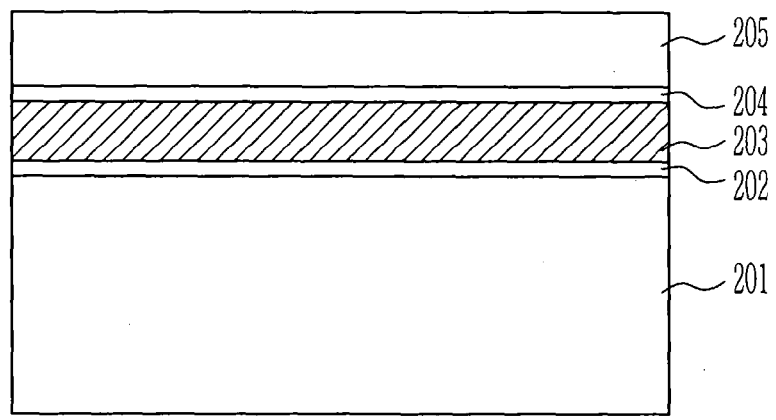
FIG. 2a through FIG. 2i are cross-sectional views of semiconductor devices for explaining a disclosed method of forming an isolation film in the device according to another embodiment.

Referring to FIG. 2a, a pad oxide film 202, an amorphous silicon film 203, an anti-reflection film 204 and a photoresist film 205 are sequentially formed on a semiconductor substrate 201. In the above, the pad oxide film 202 is formed in thickness in the range of from about 50 to about 200 Å, the amorphous silicon film 203 is formed in thickness in the range of from about 1000 to about 3000 Å, the anti-reflection film 204 is formed in thickness in the range of from about 500 to about 800 Å and the photoresist film 205 is formed in thickness in the range of from about 3000 to about 10000 Å. At this time, the amorphous silicon film 203 is formed by a low pressure chemical vapor deposition (LP CVD) at a temperature in the range of from about 400 to about 600° C.

Figure 2B:
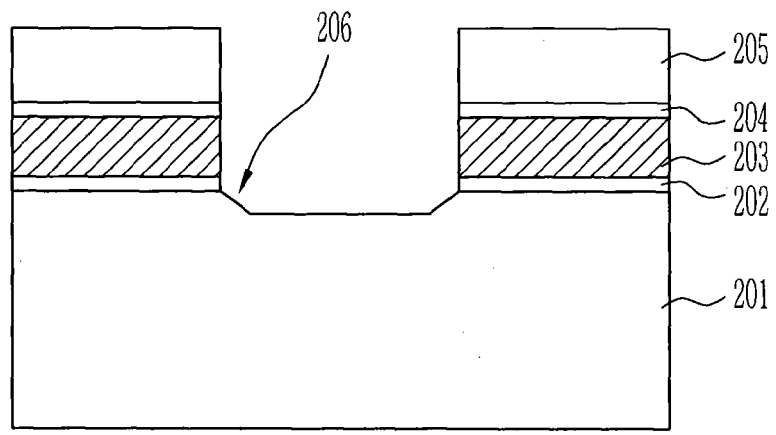

By reference to FIG. 2b, the photoresist film 205 and the anti-reflection film 204 of the isolation region are removed trough exposure and development processes, thereby forming the photoresist pattern 205 and the anti-reflection film 204 in which the isolation region is defined. After the photoresist pattern 205 is formed, the amorphous silicon film 203 and the pad oxide film 202 that were exposed by the removed photoresist film and anti-reflection film are removed by a dry etch process, thus exposing the surface of the semiconductor substrate 201 of the isolation region., Thereafter, an over etch process is implemented while polymer (not shown) is accumulated at the corner of the exposed semiconductor substrate 201, whereby the central portion of the isolation region is more etched than the corner portions of the isolation region to form an etch slant face 206 at the substrate 201 of the corner. At this time, the width and tilt angle of the etch slant face 206 formed at the corner of the isolation region could be adjusted considering the degree of integration in the device. Preferably, the width of the etch slant face 104 is made 0.02 µm to 0.07 µm and the tilt angle of the etch slant face 206 is made from 20 to 50°.

This over etch is performed using a $CHF_3$ gas, a $CF_4$ gas or a mixed gas of them as an etch gas. A t this time, the supply flow of $CHF_3$ is 50 to 70 sccm, the supply flow of $CF_4$ is 30 to 50 sccm and an Ar gas of 1000 to 2000 sccm is supplied as a carrier gas. Meanwhile, the over etch process is implemented 5 to 30 seconds with a pressure of from about 500 to about 2500 mTorr or power of from about 600 to about 2000 W is applied. The over etch process is performed so that the central portion of the isolation region is etched to from about 50 to about 400 Å.

Figure 2C:
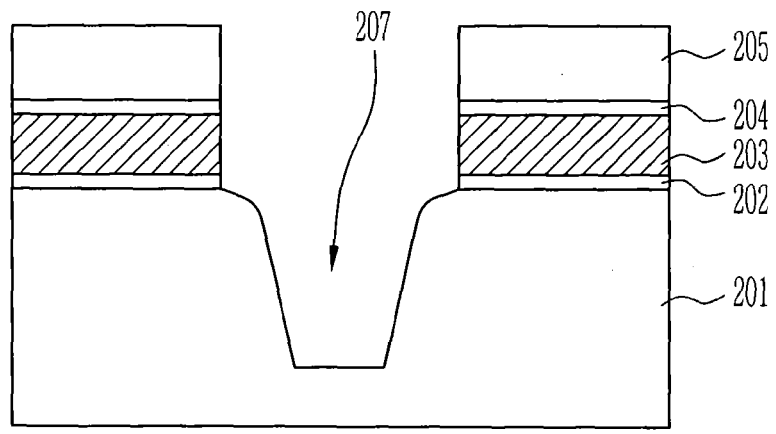

With reference to FIG. 2c, the semiconductor substrate 201 of the isolation region is etched to a given depth to form a trench 207. At this time, as polymer (not shown) is accumulated on the etch slant face 206 of the isolation region serves as an anti-etch film upon implementation of the over etch process in FIG. 2b, the corners of the isolation region are not etched but the shape of the etch slant face 206 remains intact. Accordingly, as only the central portion of the isolation region is etched, the trench 207 is formed at the central portion of the isolation region. Due to this, the top corner of the trench 207 is made round by the etch slant faces formed by the over etch process in FIG. 2b.

At this time, the etch process for forming the trench 207 is implemented to form the trench 207 of from about 2500 to about 4000 Å in depth using a N2 gas, an $O_2$ gas, a HBr gas and a Cl2 gas at a pressure of from about 5 mTorr to about 30 mTorr with a top power of from about 350 to about 550 W and a bottom power of from about 100 to about 300 W applied thereto, and make the tilt angle of the sidewall of the trench 207 from about 70 to about 90° on the basis of the surface of the semiconductor substrate 201. In the etch process, the supply flow of the $N_2$ gas is controlled to be from about 5 to about 20 sccm, the supply flow of the HBr gas is controlled to be from about 100 to about 150 sccm, the supply flow of the $Cl_2$ gas is controlled to be from about 35 to about 70 sccm and the supply flow of the $O_2$ gas is controlled to be from about 2 to about 20 sccm.

After the trench 207 is formed, an ATC (after treatment chamber) process is performed for 30 seconds to 1 minute to compensate for etch damage occurred at the sidewall and bottom of the trench 207.

Figure 2D:
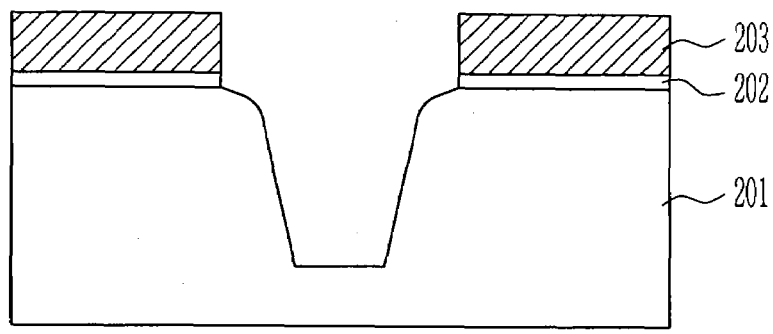

Turning to FIG. 2d, after the trench 207 is formed, the photoresist pattern (205 in FIG. 2c) and the anti-reflection film (204 in FIG. 2c) are removed. Thereby, the amorphous silicon layer 203 is exposed.

Figure 2E:
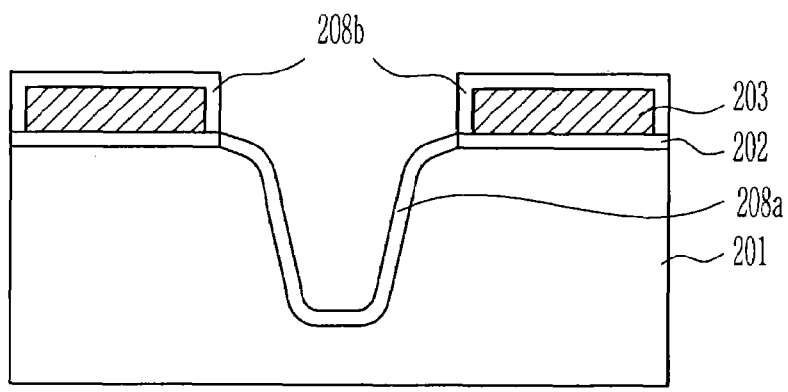

Referring to FIG. 2e, the sidewall and bottom of the trench 207 are oxidized by an oxidization process to form a surface oxide film 208a. At this time, the oxidization process is implemented at a temperature in the range of from about 900 to about 1200° C. in a dry oxidization process so that the surface oxide film 208a is formed in thickness of from about 50 to about 200 Å. By forming the surface oxide film 208a at the sidewall and bottom of the trench 207 through the oxidization process, etch damage occurred in the course of forming the trench 207 is mitigated and the top corner and bottom corner of the trench 207 is made more round.

After the surface oxide film 208a is formed on the surface of the trench 207, the surface of the amorphous silicon layer 203 is oxidized to form a surface oxide film 208b. It should be noted that the surface oxide film 208b might be formed by oxidizing the surface of the amorphous silicon layer 203 by means of $O_2$ plasma processing. In the above, the $O_2$ plasma processing method may include a method of implementing $O_2$ ashing at a temperature in the range of from about 50 to about 200° C., a method using $O_2$ ion implantation process, and the like.

Figure 2F:
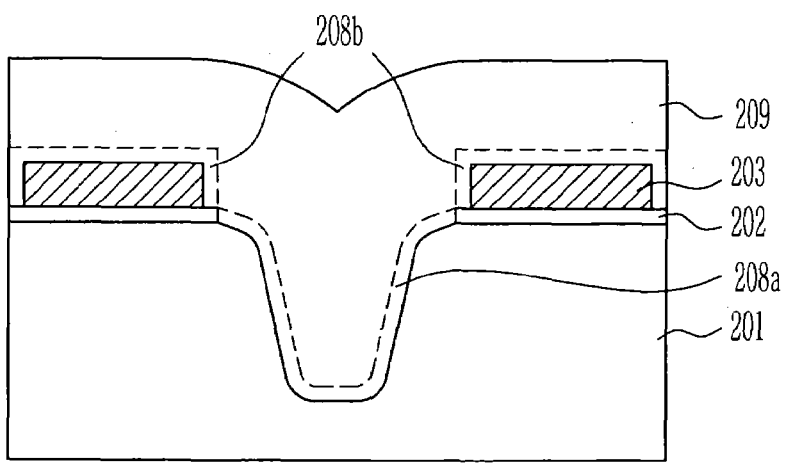

By reference to FIG. 2f, an insulating material layer 209 is formed on the entire structure so that the trench 207 is completely buried. At this time, the thickness of the insulating material layer 209 may be decided considering a margin of a chemical mechanical polishing process to be performed in a subsequent process. Preferably, the insulating material layer 209 may be formed with a thickness in the range of from about 4000 to about 6000 Å.

Figure 2G:
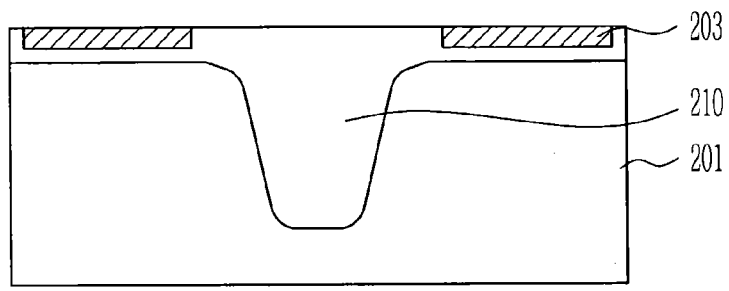

With reference to FIG. 2g, the top of the insulating material layer (209 in FIG. 2f) is removed by a given thickness until the amorphous silicon layer 203 is exposed by means of a polishing process such as the chemical mechanical polishing process. Thereby, the insulating material layer remains only in the trench, so that the isolation film 210 made of the insulating material layer is formed. At this time, as the height of the remaining amorphous silicon layer 203 determines the height of the isolation film 210 that is protruded higher than the surface of the semiconductor substrate 201, the polishing process must be performed considering it.

Figure 2H:
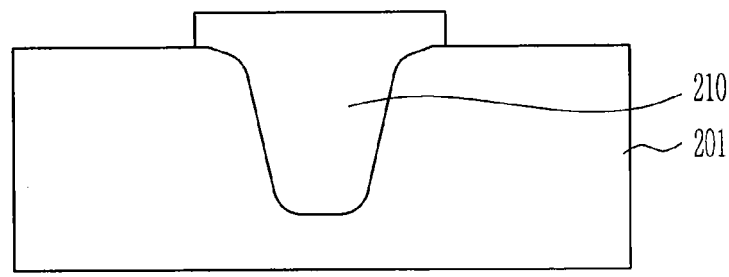

Turning to FIG. 2h, the amorphous silicon layer (203 in FIG. 2f) and the pad oxide film (202 in FIG. 2f) are removed by a cleaning process. Thereby, only the isolation film 210 remains.

Figure 2I:
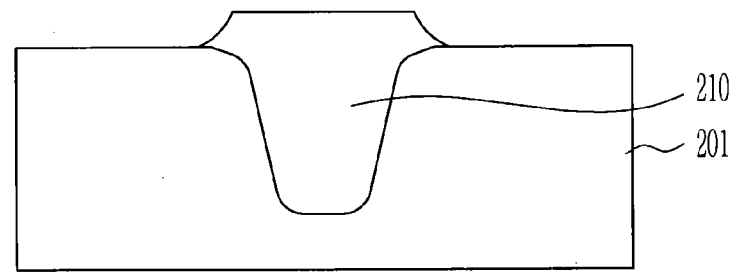

From FIG. 2i, it can be seen that a moat did not occur even when the isolation film 210 is formed by the above process although both corner portions of the isolation film are etched by etch and cleaning processes being a subsequent process after the isolation film 210 is formed.

FIG. 3a through FIG. 3h are cross-sectional views of the semiconductor devices for explaining the method of forming the isolation film in the device according to still another embodiment.

Figure 3A:
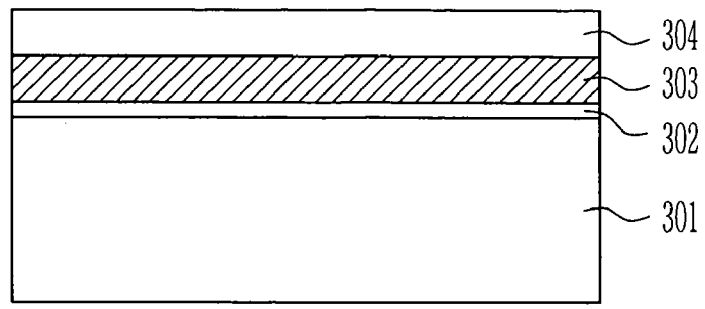
FIG. 3a through FIG. 3h are cross-sectional views of semiconductor devices for explaining a disclosed method of forming an isolation film in the device according to still another embodiment.

Referring to FIG. 3a, a pad oxide film 302, an amorphous silicon film 303 and a hard mask film 304 are formed on a semiconductor substrate 301.

A pre-treatment cleaning process is implemented using DHF (dilute HF) where a mixed ratio of $H_2O$ and HF is about 50:1 and a SC-1 (standard cleaning-1) solution consisting of $NH_4OH$, $H_2O_2$ and $H_2O$, or BOE (buffered oxide etch) is used with a mixed ratio of $NH_4F$ and HF is from about 100:1 to about 300:1. After the cleaning process, the pad oxide film 302 is formed in a thickness in the range of from about 50 to about 200 Å in a dry or wet oxidization mode. After the pad oxide film 302 is deposited, the crystal density at the interface between the pad oxide film 302 and the semiconductor substrate 301 could be minimized by implementing an annealing process using N2 at a temperature in the range of 900 to 910° C. for a time period in the range of from about 20 to about 30 minutes.

An undoped amorphous silicon film of from about 1000 to about 2000 Å in thickness is deposited on the pad oxide film 302 at a temperature of from about 400 to about 600° C. and pressure of 0.1 to 3.0 torr by means of a chemical vapor deposition (CVD) method, a low pressure CVD (LPCVD) method, a plasma enhanced CVD (PECVD) method or an atmospheric pressure CVD (APCVD) method. As such, the grain size of the amorphous silicon film 303 is minimized and concentration of the electric field could be thus prevented. A nitride film having a thickness in the range of from about 1000 to about 2000 Å is deposited on the amorphous silicon film 303 by means of the LP-CVD method, thereby forming the hard mask film 304.

Those having skill in the art will appreciate that the disclosed methods are not limited thereto and the above processes may be performed after ion implantation is performed. For example, a screen oxide film (not shown) serving as a buffer layer for prohibition of crystal defect on the surface of the substrate or surface processing and ion implantation is deposited. Ion implantation is then implemented to form an ion layer (not shown) for a well or VT control. After the screen oxide film is removed, the pad oxide film 302, the amorphous silicon film 303 and the hard mask film 304 are deposited.

Figure 3B:
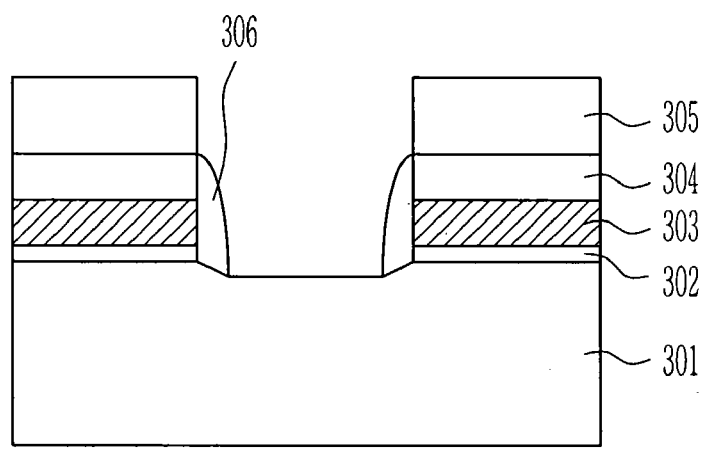

By reference to FIG. 3b, a photoresist pattern 305 for forming a trench for device isolation is formed. An etch process using the photoresist pattern 305 as an etch mask is then implemented to sequentially etch the hard mask film 304, the amorphous silicon film 303 and the pad oxide film 302, whereby the semiconductor substrate 301 is exposed.

In order to make a complementary corner portion of the trench formed round in a subsequent process, an excessive etch using a gas such as $CF_4$ and $CHF_3$ is implemented to remove a part of the semiconductor substrate 301. As such, a polymer film 306 of a spacer shape is formed at the sidewall of the hard mask film 304, the amorphous silicon film 303 and the pad oxide film 302.

A photoresist film of from about 3000 to about 10000 Å in thickness is coated on the hard mask film 304. A photolithography process using a mask for device isolation is then implemented to form the photoresist pattern 305. Next, a dry etch process using the photoresist pattern 305 as an etch mask is performed to etch the hard mask film 304, the amorphous silicon film 303 and the pad oxide film 302.

An over etch using a fluorine series gas is implemented to etch the semiconductor substrate 301 of about 200 Å while forming the polymer film 306 of the spacer shape at the sidewall of the pad oxide film by polymer generated at that time. The over etch is implemented in a dry etch mode using a $CHF_3$ gas of 50 to 70 sccm, a $CF_4$ gas of from about 30 to about 50 sccm and an Ar gas of from about 1400 to about 1600 sccm at a pressure of from about 1400 to about 1600 mTorr under a power of 1100 to 1300 W, thus generating polymer of a large quantity. In the polymer film 306 of the sidewall spacer shape, a step between the pad oxide film 302 and the semiconductor substrate 301 is caused by an etch passivation effect due to the over etch. For this reason, the top corner of the trench for device isolation to be formed in a subsequent process becomes round. The shape of the round corner has a trench corner width of about 0.015 Å and an inclination of from about 20 to about 50°.

Figure 3C:
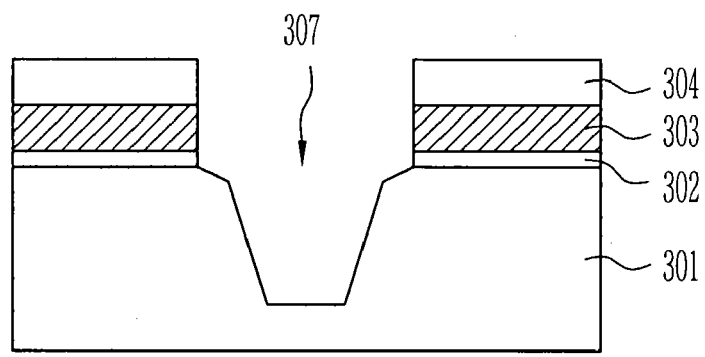

With reference to FIG. 3c, an etch process using the photoresist pattern 305 and the polymer film 306 of the spacer shape formed at the sidewall of the etched face as an etch mask is implemented to remove a part of the semiconductor substrate 301, thereby forming a trench 307 of a STI structure. A dry oxidization process for compensating for etch damage of the sidewall of the trench 307 of the STI structure is then implemented to make round the corner portion of the trench 307. Next, a high temperature oxide (HTO) is thinly deposited on the entire structure and a densification process at high temperature is then performed to form a liner oxide film (not shown). It should be noted that the dry oxidization process and the process of depositing the liner oxide film might be omitted for the purpose of simplifying the process.

The depth and inclination of the trench 307 could be adjusted by etching the semiconductor substrate 301 through the etch process of various mode. In a state that a pressure of 15 mTorr and a power of from about 450 W to about 200 W are applied, the trench 307 is formed using a $N_2$ gas of 10 sccm, a HBr gas of from about 100 to about 150 sccm, a $Cl_2$ gas of from about 35 to about 70 sccm and an $O_2$ gas of 8 sccm, wherein the trench 307 having a depth of from about 2500 to about 4000 Å and an inclination of from about 70 to about 90° is formed by controlling the flow and etch time of the gases. After the trench 307 is formed, an after treatment chamber (ATC) processing may be implemented in order to improve the roughness of the sidewall and bottom of the trench 307. The shape of the trench 307 will be examined. The trench 307 is formed to have a shape of a dual inclination including an area of a given inclination at the top corner in the polymer film formation process and a side of a given inclination formed by patterning a portion of a subsequent semiconductor substrate 301.

A photoresist strip process is implemented to remove the photoresist pattern 305 formed on the hard mask film 304 and the polymer film 306 of the spacer shape.

Figure 3D:
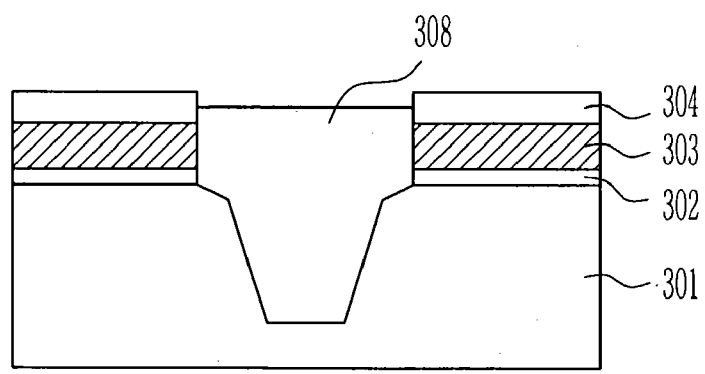

Turning to FIG. 3d, a field oxide film 308 of from about 4000 to about 6000 Å in thickness is deposited on the entire structure in which the trench 307 is formed, considering a margin of a subsequent polishing process, wherein the field oxide film 308 is buried so that an empty spacer is not formed within the trench 207. A polishing process is then performed. At this time, the polishing process is implemented with chemical mechanical polishing using the hard mask film 304 as a stop layer. Furthermore, the height of the field oxide film 309 could be controlled by adjusting a polishing target of the polishing process.

Figure 3E:
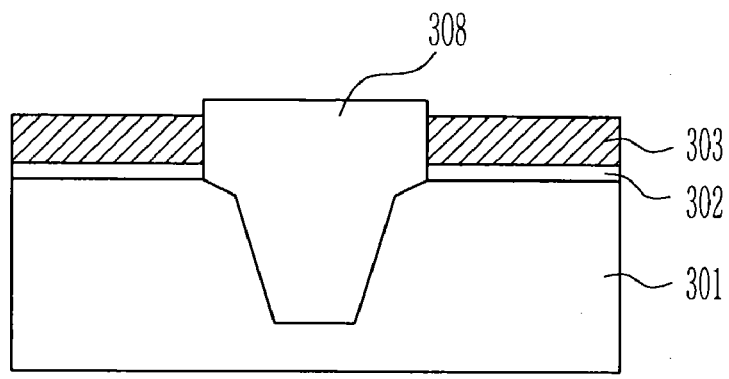
Figure 3F:
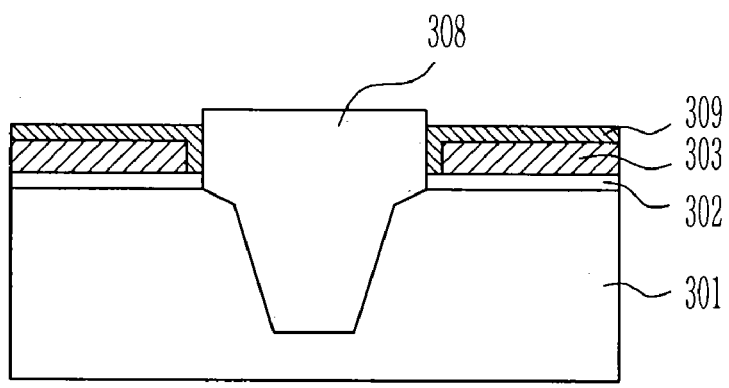

Referring to FIG. 3e and FIG. 3f, a nitride film strip process using a phosphoric acid ($H_3PO_4$) solution is implemented to remove the hard mask film 304. The field oxide film 309 is protruded higher than the amorphous silicon film 303 due to removal of the hard mask film 304. A portion of the amorphous silicon film 303 is oxidized through the $O_2$ plasma processing to form a silicon oxide film 309 on the top and sidewall of the amorphous silicon film 303.

The $O_2$ plasma processing is implemented to oxidize the surface of the amorphous silicon film 303 using a plasma ashing method and an $O_2$ ion implantation method having a temperature range of from about 50 to about 200° C. T hereby, the amorphous silicon film 303 at the sidewall of the field oxide film 308 is oxidized and the oxidized silicon oxide film 309 and the field oxide film 308 are fused, so that the isolation film region is expanded. The $O_2$ ion implantation method is rotated four times from 0 to 30° and implants $O_2$ ion at the dose of from about 1E14 to about 1E16 atoms/$cm^2$. The plasma ashing method is implemented using an $O_2$ gas of about 1500 sccm at a pressure of about 800 mTorr, a power of about 1500 W and a temperature of about 110° C. At this time, oxidization of the amorphous silicon film 303 could be controlled by variously changing the power, pressure and flow of the gas. Furthermore, oxidization of the amorphous silicon film 303 could be controlled using time setting or important factors.

Figure 3G:
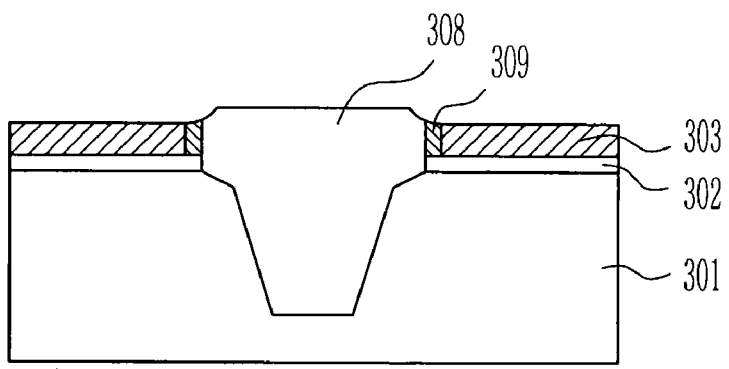
Figure 3H:
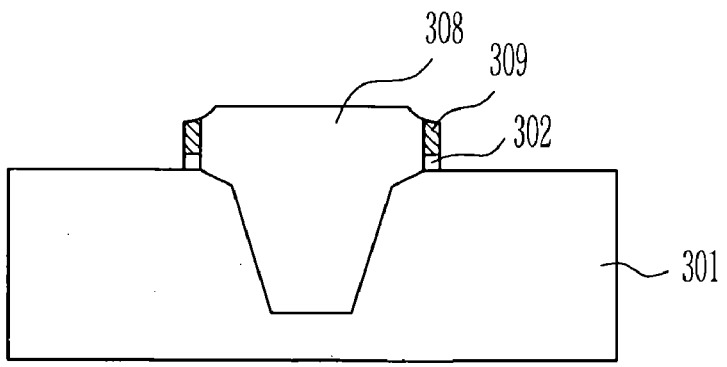

By reference to FIG. 3g and FIG. 3h, a wet or dry etch process is implemented to remove the oxide film 309 formed on the amorphous silicon film 303. The amorphous silicon film 303 and the pad oxide film 302, which remain on the semiconductor substrate, are then removed.

The etch process is implemented to etch the oxide film 309 on the amorphous silicon film 303 using a target that stops etching until the amorphous silicon film 303 that is not oxidized through the $O_2$ plasma oxidization process is exposed. A wet etch process using a nitride acid ($HNO_3$) aqueous solution is then implemented to etch the amorphous silicon film 303. Next, a cleaning process is implemented to etch the pad oxide film 302, whereby the isolation film protruded up to the active region is formed. The isolation film is formed to have a shape in which the inside of the trench 307 is completely buried with the field oxide film 308 and portions of the silicon oxide film 309 and the pad oxide film 302 remain on the active region. The field oxide film 308 formed through the present embodiment is formed higher than the active region and widely up to the active region. Accordingly, the moat does not occur although both the corners are excessively etched.

As described above, the surface oxide film formed on the photoresist pattern is fused with the insulating film or the surface oxide film formed on the amorphous silicon layer is fused with the insulating material layer. The width of the top of the isolation film is thus widened up to the top of the active region in the semiconductor substrate while keeping the width of the trench intact. Therefore, the disclosed materials have new effects that they can prevent a Homp characteristic since a moat is not generated although both corners of the isolation film are excessively etched and prevent degradation in characteristic of the semiconductor device such as subthreshold of the semiconductor device. Furthermore, the disclosed methods have advantageous effects that they can prevent concentration of an electric field on the top corner of the trench by forming a dual slant angle by forming the etch slant face at the top corner of the trench and improve the roughness of the sidewall and bottom of the trench through an ATC processing.

The forgoing embodiments are merely exemplary and are not to be construed as limiting as present teachings can be readily applied to other types of apparatuses. The description of the disclosed methods is intended to be illustrative, and not to limit the scope of the claims. Many alternatives, modifications, and variations will be apparent to those skilled in the art.

What is claimed are:

1. A method of forming an isolation film in a semiconductor device, comprising:
    forming a stack structure of a pad oxide film and a photoresist pattern on a semiconductor substrate on which an isolation region is defined, the isolation region having one or more corners and a central portion, the photoresist pattern containing silicon;
    implementing an over etch so that polymer is formed at the corners of the isolation region to form an etch slant face at one or more corners of the isolation region while etching the semiconductor substrate at the central portion of the isolation region;
    forming a trench at the central portion of the isolation region;
    oxidizing a surface of the photoresist pattern to form a surface oxide film;
    forming an insulating material layer on the entire structure to bury the trench; and
    implementing a polishing process until the photoresist pattern has a given thickness and then removing the photoresist pattern and the pad oxide film.

2. The method as claimed in claim 1, wherein the amount of silicon contained in the photoresist pattern is in the range of from about 7 to about 50%.

3. The method as claimed in claim 1, wherein the over etch process uses a $CHF_3$ gas, a $CF_4$ gas or a mixture thereof as an etch gas to etch the central portion of the isolation region in depth an amount ranging from about 50 to about 400 Å.

4. The method as claimed in claim 3, wherein a supply flow of $CHF_3$ is from about 50 to about 70 sccm, the supply flow of $CF_4$ is from about 30 to about 50 sccm and an Ar gas flow of from about 1000 to about 2000 sccm is supplied as a carrier gas.

5. The method as claimed in claim 1, wherein the over etch process is implemented for a time period from about 5 to about 30 seconds with a pressure of from about 500 to about 2500 mTorr and a power of from about 600 to about 2000 W is applied.

6. The method as claimed in claim 1, wherein a width of the etch slant face is from about 0.02 μm to about 0.07 μm and a tilt angle of the sidewall of the etch slant face is from about 20 to about 50°.

7. The method as claimed in claim 1, wherein the surface oxide film is formed by means of an $O_2$ plasma processing.

8. The method as claimed in claim 7, wherein the $O_2$ plasma processing is implemented at a temperature ranging from about 50 to about 200° C. by means of an $O_2$ ashing process or an $O_2$ ion implantation process.

9. The method as claimed in claim 1, wherein the insulating material layer is formed using a low thermal oxide film at a temperature ranging from about 50 to about 300° C.

10. A method of forming an isolation film in a semiconductor device, comprising the steps of:
    forming a stack structure of a pad oxide film, an amorphous silicon layer, an anti-reflection film and a photoresist pattern on a semiconductor substrate on which an isolation region and an active region are is defined;
    implementing an over etch so that polymer is formed at a corner of the isolation region to form an etch slant face at the corner of the isolation region while etching the semiconductor substrate at the central portion of the isolation region;
    forming a trench at the central portion of the isolation region;
    removing the photoresist pattern and the anti-reflection film;
    oxidizing the surface of the amorphous silicon layer to form a surface oxide film;
    forming an insulating material layer on the entire structure to bury a the trench; and
    implementing a polishing process until the insulating material layer is at a given thickness and then removing the amorphous silicon layer and the pad oxide film, thereby forming an isolation film, wherein the top surface of the isolation film protrudes higher than the active region of the semiconductor substrate.

11. The method as claimed in claim 10, wherein the over etch process uses a $CHF_3$ gas, a $CF_4$ gas or a mixed gas of them as an etch gas to etch to a depth of about 50 Å to about 400 Å.

12. The method as claimed in claim 10, wherein the width of the etch slant face ranges from about 0.02μm to about 0.07μm, and the tilt angle of the etch slant face ranges from about from 20° to about 50°.

13. The method as claimed in claim 10, further comprising the step of oxidizing the sidewall and bottom of the trench to form a surface oxide film at the sidewall and bottom of the trench before the surface of the amorphous silicon layer is oxidized and after the anti-reflection film is removed.

14. The method as claimed in claim 10, wherein the surface oxide film is formed by means of an $O_2$ plasma process.

15. The method as claimed in claim 14, wherein the $O_2$ plasma process is implemented at a temperature ranging from about 50° C. to about 200° C. by means of an $O_2$ ashing process or an $O_2$ ion implantation process.

16. A method of forming an isolation film in a semiconductor device, comprising the steps of:
    stacking a pad oxide film, an amorphous silicon layer, a hard mask film, and a photoresist pattern on a semiconductor substrate on which an isolation region and an active region are defined;
    implementing an over etch so that polymer is formed at a corner of the isolation region to form an etch slant face at the corner of the isolation region while etching the semiconductor substrate at the central portion of the isolation region;
    etching a part of the semiconductor substrate using the polymer as an etch mask to form a trench at the central portion of the isolation region;
    burying the trench with an insulating film and then removing the polymer and the hard mask film;

implementing an $O_2$ plasma oxidization process to oxidize the top and sidewall of the amorphous silicon layer, thus forming an oxide film on the top and sidewall of the amorphous silicon layer;

etching the oxide film on the top of the amorphous silicon layer; and etching the amorphous silicon layer and the pad oxide film below the oxide film on the side of the amorphous silicon layer, thereby forming an isolation film, wherein the top surface of the isolation film protrudes higher than the active region of the semiconductor substrate.

17. The method as claimed in claim 16, wherein the $O_2$ plasma oxidization process implemented to oxidize the top and sidewall of the amorphous silicon layer uses a plasma ashing method and an $O_2$ ion implantation method having a temperature ranging from about 50° C. to about 200° C.

18. The method as claimed in claim 16, wherein the polymer is formed by etching about 200Å of the semiconductor substrate using a gas such as $CF_4$ and $CHF_3$.

* * * * *